(12) United States Patent
Hanafusa

(10) Patent No.: US 8,470,450 B2
(45) Date of Patent: Jun. 25, 2013

(54) METHOD OF PRODUCING TWO-LAYERED COPPER-CLAD LAMINATE, AND TWO-LAYERED COPPER-CLAD LAMINATE

(75) Inventor: Mikio Hanafusa, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 12/810,160

(22) PCT Filed: Dec. 15, 2008

(86) PCT No.: PCT/JP2008/072754
§ 371 (c)(1),
(2), (4) Date: Jun. 23, 2010

(87) PCT Pub. No.: WO2009/084412
PCT Pub. Date: Jul. 9, 2009

(65) Prior Publication Data
US 2010/0279069 A1    Nov. 4, 2010

(30) Foreign Application Priority Data
Dec. 27, 2007    (JP) .................. 2007-337026

(51) Int. Cl.
| | | |
|---|---|---|
| B32B 15/04 | (2006.01) | |
| B32B 15/08 | (2006.01) | |
| B32B 15/20 | (2006.01) | |
| B05D 3/02 | (2006.01) | |
| C23C 14/34 | (2006.01) | |
| C23C 14/58 | (2006.01) | |
| C23C 28/02 | (2006.01) | |
| H05K 1/02 | (2006.01) | |
| H05K 1/03 | (2006.01) | |
| H05K 3/16 | (2006.01) | |
| H05K 3/38 | (2006.01) | |

(52) U.S. Cl.
USPC ........... 428/626; 428/674; 428/607; 428/680; 428/458; 428/675; 204/192.14; 204/192.15; 205/291; 205/224; 205/183; 205/184; 205/186; 427/99.2; 427/372.2; 427/383.1; 427/404

(58) Field of Classification Search
USPC ................. 428/624, 626, 674, 687, 607, 666, 428/680, 678, 458, 141, 675
See application file for complete search history.

(56) References Cited

U.S. PATENT DOCUMENTS

| | | |
|---|---|---|
| 5,685,970 A | 11/1997 | Ameen et al. |
| 6,638,642 B2 | 10/2003 | Kitano et al. |

(Continued)

FOREIGN PATENT DOCUMENTS

| | | |
|---|---|---|
| JP | 2002-280684 A | 9/2002 |
| JP | 2006-175634 A | 7/2006 |

(Continued)

OTHER PUBLICATIONS

Machine Translation, Tauchi et al., JP 2006-346874, Dec. 2006.*

(Continued)

*Primary Examiner* — Michael La Villa
(74) *Attorney, Agent, or Firm* — Howson & Howson LLP

(57) ABSTRACT

Provided is a method of producing a two-layered copper-clad laminate with improved folding endurance, wherein the two-layered copper-clad laminate retains folding endurance of 150 times or more measured with a folding endurance test based on JIS C6471 by subjecting the laminate in which a copper layer is formed on a polyimide film through sputtering and plate processing to heat treatment at a temperature of 100° C. or more but not exceeding 175° C. Specifically, provided are a method of producing a two-layered copper-clad laminate (two-layered CCL material) in which a copper layer is formed on a polyimide film through sputtering and plate processing, wherein the rupture of the outer lead part of a circuit can be prevented due to the improvement in folding endurance; and a two-layered copper-clad laminate obtained from the foregoing method.

5 Claims, 1 Drawing Sheet

U.S. PATENT DOCUMENTS

| | | |
|---|---|---|
| 6,833,198 B2 | 12/2004 | Sakamoto et al. |
| 6,835,241 B2 | 12/2004 | Tsuchida et al. |
| 6,960,391 B2 | 11/2005 | Natsume et al. |
| 7,341,796 B2 | 3/2008 | Hanafusa |
| 2001/0030122 A1 | 10/2001 | Hara et al. |
| 2002/0182432 A1 | 12/2002 | Sakamoto et al. |
| 2004/0053019 A1 | 3/2004 | Yamamoto et al. |
| 2004/0161627 A1* | 8/2004 | Yoshihara et al. .......... 428/607 |
| 2004/0163842 A1 | 8/2004 | Okada et al. |
| 2004/0209109 A1 | 10/2004 | Tsuchida et al. |
| 2006/0068184 A1 | 3/2006 | Hamada et al. |
| 2006/0073315 A1* | 4/2006 | Orikabe .................... 428/209 |
| 2006/0154037 A1* | 7/2006 | Shimokawa et al. ......... 428/216 |
| 2007/0170069 A1 | 7/2007 | Tsuchida et al. |
| 2008/0038522 A1 | 2/2008 | Hamada et al. |
| 2009/0092789 A1* | 4/2009 | Tsuchida et al. ............ 428/141 |
| 2009/0162685 A1 | 6/2009 | Kobayashi et al. |
| 2009/0208762 A1 | 8/2009 | Akase |
| 2010/0018273 A1 | 1/2010 | Sato |
| 2010/0040873 A1 | 2/2010 | Kohiki et al. |
| 2010/0051451 A1 | 3/2010 | Sato |

FOREIGN PATENT DOCUMENTS

| | | | |
|---|---|---|---|
| JP | 2006-346874 | * | 12/2006 |
| JP | 2007-214519 A | | 8/2007 |
| JP | 2007-262493 A | | 10/2007 |
| WO | WO 2007/039992 | * | 4/2007 |

OTHER PUBLICATIONS

Tabenkin, "Quality 101: Surface Finish Measurement Basics," downloaded from www.qualitymag.com on Feb. 22, 2012, dated Sep. 2004.*

* cited by examiner

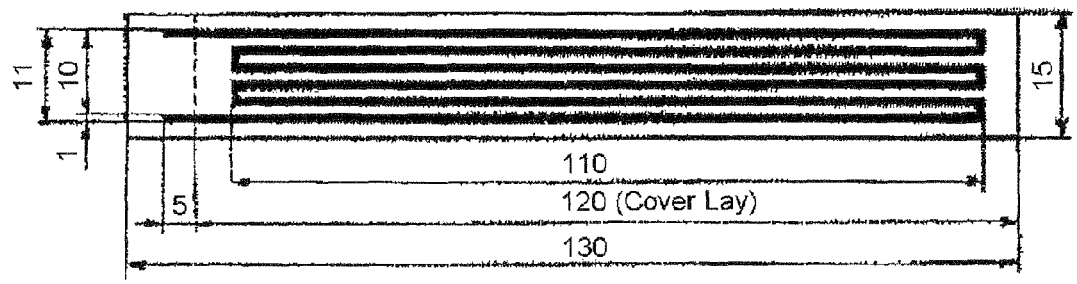

METHOD OF PRODUCING TWO-LAYERED COPPER-CLAD LAMINATE, AND TWO-LAYERED COPPER-CLAD LAMINATE

BACKGROUND OF THE INVENTION

The present invention relates to a method of producing a two-layered copper-clad laminate in which a copper layer is formed on a polyimide film through sputtering and plate processing and the folding endurance of the laminate is improved, as well as to a two-layered copper-clad laminate obtained from the foregoing method.

Incidentally, the foregoing two-layered copper-clad laminate covers cases of forming a thin interlayer in order to increase the bond strength, and this is collectively referred to as a "two-layered copper-clad laminate" of a polyimide film and a copper layer.

Recently, two-layered copper-clad laminate (CCL: Cu Clad Laminate) material in which a copper layer is formed on a polyimide film has been used as circuit material in driver IC for liquid crystal display and other devices, for which fine pitch circuits are required. Among the two-layered CCL materials used as laminate materials for COF (Chip On Film), attention is particularly focused on the two-layered CCL material manufactured by sputtering and plate processing.

The two-layered CCL material is produced by forming a copper layer with a submicron-level thickness on a polyimide film (PI) through sputtering and then forming a copper layer through copper-sulfate plating. The basic invention is described in Patent Document 1 indicated below.

A COF (Chip On Film) is used in flat-panel televisions such as LCD televisions and organic EL televisions, and since the outer lead part of the circuit is used by being folded, the folding endurance needs to be high.

Nevertheless, the circuit line width became narrow due to the advancement in finer pitches of circuits, and a problem arose in that the strength deteriorated. Consequently, a problem arose in that a disconnection of the outer lead part would occur.

[Patent Document 1] U.S. Pat. No. 5,685,970

SUMMARY OF THE INVENTION

In light of the above, an object of the present invention is to provide a method of producing a two-layered copper-clad laminate (two-layered CCL material) in which a copper layer is formed on a polyimide film through sputtering and plate processing, wherein the rupture of the outer lead part of a circuit can be prevented due to the improvement in folding endurance; and a two-layered copper-clad laminate obtained from the foregoing method.

As a result of intense study in order to solve the above issues, the present inventors discovered that the folding endurance can be considerably improved by performing heat treatment under specific conditions when producing a two-layered CCL material in which a copper layer is formed on a polyimide film through sputtering and plate processing.

Based on the foregoing discovery, the present invention provides:

1) A method of producing a two-layered copper-clad laminate with improved folding endurance, wherein the two-layered copper-clad laminate retains folding endurance of 150 times or more measured with a folding endurance test based on JIS C6471 by subjecting the laminate in which a copper layer is formed on a polyimide film through sputtering and plate processing to heat treatment at a temperature of 100° C. or more but not exceeding 175° C.; and 2) The method of producing a two-layered copper-clad laminate according to 1) above, wherein a NiCr alloy is formed on a polyimide film through sputtering, and a NiCr alloy layer is formed between the polyimide film and the copper layer.

The present invention additionally provides:

3) A two-layered copper-clad laminate having a polyimide film and a copper layer formed thereon, wherein the two-layered copper-clad laminate retains folding endurance of 150 times or more measured with a folding endurance test based on JIS C6471; and 4) The two-layered copper-clad laminate according to 3) above, wherein a NiCr alloy layer is further provided between the polyimide film and the copper layer.

The two-layered copper-clad laminate according to the present invention yields a superior effect of improving the folding endurance and effectively preventing the rupture of the outer lead part of a circuit.

BRIEF DESCRIPTION OF DRAWINGS

[FIG. 1] An explanatory diagram of a test specimen that is used in the folding endurance test (JIS C6471).

DETAILED DESCRIPTION OF THE INVENTION

As for the two-layered copper-clad laminate according to the present invention; after a polyimide film is placed in a vacuum chamber and the film surface is activated by plasma treatment, a single metal layer of Ni, Co or Cr, or an alloy layer formed from 2 or more types of such metals, for instance, a NiCr layer (20% Cr), is deposited 10 to 30 nm thick through sputtering, and thereafter a copper layer of a submicron level thickness is formed through sputtering.

The copper layer formed as described above is referred to as a copper seed layer, since it is used as a seed for subsequently forming the electrolytic copper layer.

Subsequently, plate processing is performed using the copper seed layer. The plate processing is performed with copper sulfate plating or the like. As a result of adjusting the current density and electrolyte temperature during the plating, the plating thickness can be adjusted to an arbitrary thickness. A two-layered copper-clad laminate of a polyimide film and a copper layer can thereby be obtained. For the plate processing, the plating solution (refer to WO 2006/080148) that was previously developed by the Applicant may be used. The surface roughness of the plated surface was Ra 0.01-0.04, Rt 0.14-1.0, and Rz 0.1-0.90 as a result of measurement with a surface roughness meter of noncontact type (Veeco products).

Before forming the copper layer with a submicron-level thickness by sputtering, it is possible to form a tie-coat layer made of NiCr on the surface of the polyimide film by sputtering. The plasma treatment of the polyimide film surface and the tie-coat layer are effective means for improving adhesive property. The present invention includes these treatments.

As described above, the foregoing two-layered copper-clad laminate covers cases of forming a thin interlayer, namely a tie-coat layer formed of NiCr, in order to increase the bond strength, and this is collectively referred to as a "two-layered copper-clad laminate" of a polyimide film and a copper layer.

Although there is no particular limitation on the polyimide film to be used in the two-layered CCL material as long as the present invention can be achieved, preferably, a polyimide film of BPDA-PPD system is used.

The two-layered copper-clad laminate in which a copper layer was formed on a polyimide film through sputtering and plate processing is subject to heat treatment at a temperature of 100° C. or more but not exceeding 175° C. The two-layered copper-clad laminate is thereby able to retain folding endurance of 150 times or more measured with a folding endurance test based on JIS C6471.

If the temperature is less than 100° C. or exceeds 175° C., which is outside the scope of the heat treatment conditions of the present invention; in each case, the two-layered copper-clad laminate is unable to retain folding endurance of 150 times or more. Thus, the heat treatment needs to be performed at a temperature of 100° C. or more but not exceeding 175° C.

The test conditions of the folding endurance test based on JIS C6471 were as follows:
R=0.38, test load: 500 gf, folding angle: 135°±5°, 175 cpm (folding at a ratio of 175 times per minute), used specimen for folding endurance test: L/S=1 mm.

And the number of times up to the rupture was defined as the folding endurance.

Upon preparing the test specimen, a dry film was pressure-bonded on the two-layered copper-clad laminate that was subject to the heat treatment, and this was exposed to form a pattern and then subject to etching processing in order to eliminate the unwanted parts of copper. Finally, the dry film was eliminated to form a circuit on the polyimide film. The test specimen prepared as described above was used in the test.

This method of forming circuit is a method that is normally used, and other methods may also be adopted. As an etching solution for copper layer, the etching solution of the following solution composition is normally used.
(Solution Composition)
Copper chloride solution ($CuCl_2$), Copper oxide (CuO)
Hydrochloric acid (HCl): 3.50 mol/L (adjusted within the range of 0 to 6 mol/L)
Hydrogen peroxide ($H_2O_2$): 30.0 Cap (adjusted within the range of 0 to 99.9 Cap)

EXAMPLES

Characteristics of the present invention will be specifically explained based on Examples and Comparative Examples. Incidentally, the following explanation is given in order to facilitate understanding of the invention, and the invention will not be limited by this explanation. In other words, this invention includes variations, embodiments, and other examples based on the technical ideas of this invention.

Example 1

A polyimide film (Upilex SGA manufactured by Ube Industries, Ltd.) having a thickness of 34 μm was used, a NiCr layer (20% Cr) was deposited thereon 25 nm thick through sputtering, and a copper layer having a thickness of 8 μm was formed through sputtering and plate processing. The two-layered copper-clad laminate was subject to heat treatment at 100° C. for 2 hours using a vacuum heat treatment furnace.

A dry film was laminated on the two-layered copper-clad laminate that was subject to the foregoing heat treatment, this was exposed to form a pattern, and the unwanted parts of copper were eliminated by etching processing using the foregoing etching solution in order to form a circuit of L/S=1 mm.

Finally, the dry film was eliminated to prepare a test specimen having a size of 15 mm×130 mm. Although the circuit on the polyimide film is configured from a single continuous circuit line, it has a structure that the circuit line is folded back in a longitudinal direction of the polyimide film so that 6 alignments of the circuit line are arranged in parallel. The explanatory diagram of the test specimen is shown in FIG. 1.

This test specimen was used to perform a folding endurance test based on JIS C6471. The test machine manufactured by Tester Sangyo Co., Ltd. was used. The test was conducted under the conditions of R=0.38, test load: 500 gf, folding angle: 135 degrees, and 175 cpm (folding at a ratio of 175 times per minute). Including the Examples and Comparative Examples described later, the results are shown in Table 1.

As shown in Table 1, the folding endurance (MIT) up to the rupture was 154 times. This satisfied the folding endurance of 150 times or more according to the present invention.

TABLE 1

| | Examples and Comparative Examples | | | | | | |
|---|---|---|---|---|---|---|---|
| | Example 1 | Example 2 | Example 3 | Example 4 | Comparative Example 1 | Comparative Example 2 | Comparative Example 3 |
| Heat treatment temperature (° C.) | 100 | 125 | 150 | 175 | — | 75 | 200 |
| Folding endurance (MIT) | 154 | 178 | 161 | 150 | 124 | 136 | 138 |

Folding endurance: MIT (Number of times the test specimen is folded until the rupture), —: No heat treatment

Example 2

The two-layered copper-clad laminate used in Example 1 above was subject to heat treatment at 125° C. for 2 hours using a vacuum heat treatment furnace.

As with Example 1, a dry film was laminated on the two-layered copper-clad laminate that was subject to the foregoing heat treatment, this was exposed to form a pattern, and the unwanted parts of copper were eliminated by etching processing in order to form a circuit having a width of 1 mm.

As with Example 1, a folding endurance test based on JIS C6471 was conducted. As shown in Table 1, the folding endurance (MIT) up to the rupture was 178 times. This satisfied the folding endurance of 150 times or more according to the present invention. In addition, the folding endurance (MIT) improved even more than Example 1.

Example 3

The two-layered copper-clad laminate used in Example 1 above was subject to heat treatment at 150° C. for 2 hours using a vacuum heat treatment furnace.

As with Example 1, a dry film was laminated on the two-layered copper-clad laminate that was subject to the foregoing heat treatment, this was exposed to form a pattern, and the unwanted parts of copper were eliminated by etching processing in order to form a circuit having a width of 1 mm.

As with Example 1, a folding endurance test based on JIS C6471 was conducted. As shown in Table 1, the folding endurance (MIT) up to the rupture was 161 times. This satisfied the folding endurance of 150 times or more according to the present invention. In addition, the folding endurance (MIT) improved even more than Example 1.

Example 4

The two-layered copper-clad laminate used in Example 1 above was subject to heat treatment at 175° C. for 2 hours using a vacuum heat treatment furnace.

As with Example 1, a dry film was laminated on the two-layered copper-clad laminate that was subject to the foregoing heat treatment, this was exposed to form a pattern, and the unwanted parts of copper were eliminated by etching processing in order to form a circuit having a width of 1 mm.

As with Example 1, a folding endurance test based on JIS C6471 was conducted. As shown in Table 1, the folding endurance (MIT) up to the rupture was 150 times. This satisfied the folding endurance of 150 times or more according to the present invention, but was lower than the folding endurance (MIT) of Examples 2 and 3.

Accordingly, it has been confirmed that the folding endurance can be improved with heat treatment at 100 to 175° C., but the folding endurance does not improve so much in the vicinity of the lower limit or in the vicinity of the upper limit.

In light of the above, it could be said that the conditions of Example 2 and Example 3 are more favorable conditions. Although the heat treatment is performed for 2 hours in the Examples, since the heat treatment is performed at a relatively low temperature, even if heat treatment is performed for a long time in excess of 2 hours, there is hardly any change in the folding endurance. Since prolonged heat treatment will deteriorate the productivity, the heat treatment is desirably performed within the range of approximately 1 to 5 hours.

Comparative Example 1

The two-layered copper-clad laminate used in Example 1 above was used as a test specimen without being subject to heat treatment. As with Example 1, a dry film was laminated on the two-layered copper-clad laminate that was subject to the foregoing heat treatment, this was exposed to form a pattern, and the unwanted parts of copper were eliminated by etching processing in order to form a circuit having a width of 1 mm.

As with Example 1, a folding endurance test based on JIS C6471 was conducted. As shown in Table 1, the folding endurance (MIT) up to the rupture was 124 times. This did not satisfy the folding endurance of 150 times or more according to the present invention at all. This is a conventional two-layered copper-clad laminate. That offers no solution to the problem that the circuit line width becomes narrow due to the advancement in finer pitches of circuits and the strength deteriorates, and it is much expected that an accident happens with the outer lead part disconnecting.

Comparative Example 2

The two-layered copper-clad laminate used in Example 1 above was subject to heat treatment at 75° C. for 2 hours using a vacuum heat treatment furnace.

As with Example 1, a dry film was laminated on the two-layered copper-clad laminate that was subject to the foregoing heat treatment, this was exposed to form a pattern, and the unwanted parts of copper were eliminated by etching processing in order to form a circuit having a width of 1 mm.

As with Example 1, a folding endurance test based on JIS C6471 was conducted. As shown in Table 1, the folding endurance (MIT) up to the rupture was 136 times. This did not satisfy the folding endurance of 150 times or more according to the present invention. It was thereby confirmed that this is a result of the heat treatment temperature being insufficient.

Comparative Example 3

The two-layered copper-clad laminate used in Example 1 above was subject to heat treatment at 200° C. for 2 hours using a vacuum heat treatment furnace.

As with Example 1, a dry film was laminated on the two-layered copper-clad laminate that was subject to the foregoing heat treatment, this was exposed to form a pattern, and the unwanted parts of copper were eliminated by etching processing in order to form a circuit having a width of 1 mm.

As with Example 1, a folding endurance test based on JIS C6471 was conducted. As shown in Table 1, the folding endurance (MIT) up to the rupture was 138 times. This did not satisfy the folding endurance of 150 times or more according to the present invention. It was thereby confirmed that this is a result of the heat treatment temperature being too high.

The two-layered copper-clad laminate according to the present invention yields a superior effect of improving the folding endurance and effectively preventing the rupture of the outer lead part of a circuit. Thus, the two-layered copper-clad laminate according to the present invention is ideal as circuit material in driver IC for liquid crystal display and other devices, for which fine pitch circuits are required.

The invention claimed is:

1. A method of producing a two-layered copper-clad laminate, comprising the steps of:
sputter-depositing and plating a copper layer on a polyimide film to produce a two-layered copper-clad laminate with the copper layer having a surface roughness (Rz) of 0.1 to 0.9 μm; and
subjecting the two-layered copper-clad laminate to heat treatment under vacuum at a temperature of 100 to 175° C. for 1 to 5 hours;
wherein, after said subjecting step, the two-layered copper-clad laminate has a folding endurance of 150 times or more when measured with a folding endurance test based on JIS C6471.

2. A method of producing a copper-clad laminate, comprising the steps of:
sputter-depositing a layer of a metal or an alloy composed of one or more elements selected from the group consisting of Ni, Co, and Cr on a polyimide film;
sputter-depositing and plating a copper layer on the layer of the metal or alloy to produce a copper-clad laminate with the copper layer having a surface roughness (Rz) of 0.1 to 0.9 μm; and
subjecting the copper-clad laminate to heat treatment under vacuum at a temperature of 100 to 175° C. for 1 to 5 hours;
wherein, after said subjecting step, the copper-clad laminate has a folding endurance of 150 times or more when measured with a folding endurance test based on JIS C6471.

3. A copper-clad laminate comprising a polyimide film, a tie-coat layer consisting of a metal of Ni, Co or Cr or an alloy consisting of elements selected from the group consisting of Ni, Co and Cr on the polyimide film, and a copper layer formed by sputtering and plating copper on the tie-coat layer, the copper layer having a surface roughness (Rz) of 0.1 µm, to 0.9 µm, having been subjected to heat treatment under vacuum at a temperature of 100° C. to 175° C. for one to five hours, and having a folding endurance of 150 times or more when measured with a folding endurance test based on JIS C6471.

4. A copper-clad laminate according to claim 3, wherein the tie-coat layer consists of an alloy consisting of Ni and Cr.

5. A copper-clad laminate according to claim 3, wherein the tie-coat layer consists of an alloy consisting of 20wt% Cr and a remainder of Ni.

* * * * *